(12) United States Patent
Abe

(10) Patent No.: US 7,038,142 B2
(45) Date of Patent: May 2, 2006

(54) CIRCUIT BOARD AND METHOD FOR FABRICATING THE SAME, AND ELECTRONIC DEVICE

(75) Inventor: Tomoyuki Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 205 days.

(21) Appl. No.: 10/340,744

(22) Filed: Jan. 13, 2003

(65) Prior Publication Data

US 2003/0136577 A1 Jul. 24, 2003

(30) Foreign Application Priority Data

Jan. 24, 2002 (JP) ............... 2002-015327
Mar. 15, 2002 (JP) ............... 2002-072901

(51) Int. Cl.
*H05K 1/03* (2006.01)

(52) U.S. Cl. ............ 174/255; 174/256; 174/258; 361/771; 428/209; 428/901

(58) Field of Classification Search ........ 174/255–258, 174/260; 361/792–795; 428/209, 901
See application file for complete search history.

(56) References Cited

U.S. PATENT DOCUMENTS 4,318,954 A * 3/1982 Jensen ................. 174/255
4,609,586 A * 9/1986 Jensen et al. ............... 428/209
4,875,282 A * 10/1989 Leibowitz ..................... 29/830
4,963,414 A * 10/1990 LeVasseur et al. ....... 428/195.1
4,963,697 A * 10/1990 Peterson et al. ............ 174/252
4,998,159 A * 3/1991 Shinohara et al. .......... 361/809
5,236,772 A * 8/1993 Horikoshi et al. .......... 428/209
5,306,571 A * 4/1994 Dolowy et al. ............. 428/608
5,952,712 A * 9/1999 Ikuina et al. ............... 257/678
6,011,691 A * 1/2000 Schreffler ................... 361/704
6,013,588 A * 1/2000 Ozaki .......................... 442/179
6,207,904 B1 * 3/2001 Kramer et al. .............. 174/255
6,222,740 B1 * 4/2001 Bovensiepen et al. ...... 361/795
6,329,603 B1 * 12/2001 Japp et al. ................... 174/255
6,340,796 B1 * 1/2002 Smith et al. ................. 174/255
6,534,723 B1 * 3/2003 Asai et al. ................... 174/255
6,555,052 B1 * 4/2003 Soga et al. .................. 420/560

FOREIGN PATENT DOCUMENTS

JP 2001-332828 11/2001

* cited by examiner

Primary Examiner—John B. Vigushin
(74) Attorney, Agent, or Firm—Armstrong, Kratz, Quintos, Hanson & Brooks, LLP

(57) ABSTRACT

The circuit board for mounting semiconductor elements comprises a core substrate 10 formed of a fiber reinforced metal, an insulating layer 14 formed on the core substrate 10, and an interconnection layer 20 formed on the insulating layer 14, whereby the circuit board for mounting semiconductor elements can have a thermal expansion coefficient approximate to that of silicon, and light and thin but has high rigidity.

12 Claims, 9 Drawing Sheets

CIRCUIT BOARD AND METHOD FOR FABRICATING THE SAME, AND ELECTRONIC DEVICE

CROSS-REFERENCE TO RELATED APPLICATIONS

This application is based upon and claims the benefit of priorities from the prior Japanese Patent Application No. 2002-015327, filed in Jan. 24, 2002, and the prior Japanese Patent Application No. 2002-072901, filed in Mar. 15, 2002, the entire contents of which are incorporated herein by reference.

BACKGROUND OF THE INVENTION

The present invention relates to a circuit board, a method for fabricating the circuit board and an electronic device, more specifically a circuit board for electronic parts, such as semiconductor elements, etc., to be mounted on, a method for fabricating the circuit board and an electronic device including the circuit board.

As electronic equipments typically represented by portable terminal devices, for example, are increasingly downsized and have higher performance, it is strongly required that electronic elements (e.g., semiconductor elements) to be mounted on the electronic equipments and circuit boards for the electronic elements to be mounted on are increasingly downsized and thinned, and have higher performance and higher reliability.

In order to meet the requirements, the so-called bear chip mounting which mounts directly electronic elements on circuit boards has been increasingly widely used as a mounting method for mounting the electronic elements on the circuit boards. As the electronic elements have more pins, the circuit boards for the electronic elements to be mounted on must have higher density, and the circuit boards have accordingly multi-layers.

Multi-layer circuit boards (the so-called build-up boards) formed by the build-up technology which insulating layers and conducting layers are alternately layered on one surface or both surfaces of core materials by thin film forming techniques are practically used. As the core materials of the build-up boards, organic materials, such as glass epoxy resin, etc. are generally used.

A build-up board, which has a layer structure of insulating layers and conducting layers laid by a thin film forming technique, can have micronized patterns. Accordingly, bear chips can be mounted directly on the build-up board (bear chip mounting). However, when the bare semiconductor chips are mounted on a build-up boards using a conventional organic material as a core material, the silicon chips having a thermal expansion coefficient of about 3.5 ppm/° C. are mounted directly on the build-up board having a thermal expansion coefficient of a 10–20 ppm/° C. Even with an under-fill provided, thermal stress is generated in the connection due to the thermal expansion difference between the two, and the connection reliability is decreased.

In order to mitigate such stress, a method of lowering an elastic modulus of an adhesive as an under-fill, etc. are practically used. However, as chip sizes become larger, it is apparent that even such method will not be able to sufficiently ensure the reliability of the connection. In order to ensure high reliability of the connection to the build-up board it is essential to lower the thermal expansion coefficient of the build-up board itself.

In order to reduce noises of devices for higher performance, generally decoupling capacitors are connected to the chips. In this case, depending on some mounting technologies, capacitors are often disposed on a side of the board, which is different from the side where the chips are mounted. In this case, it is preferable to make the circuit board as thin as possible from the viewpoint of shortening the connection distance between the chips and the capacitors so as to reduce the inductance.

In such background, conventionally metals or ceramics whose thermal expansion coefficients are smaller than the organic core materials have been used. The metal core boards can be fabricated by forming holes for through-holes in the core metal substrate, building up a prepregs and copper foils sequentially on both surfaces of the metal core substrate, forming the through-holes from the outer layer through the holes formed in the metal core substrate, plating copper non-electrolytically and electrolytically to form a circuit pattern on the outer layer. Specific materials of the core material are generally, as the metals, aluminum, copper, silicon steel, nickel-iron alloy, CIC (copper/invar/copper clad material) and aluminum nitride as the ceramics.

Of these materials, aluminum, etc. are light, but the thermal expansion coefficients of them are larger than that of silicon unpreferably in terms of the connection reliability. On the other hand, the thermal expansion coefficients of invar, covar, alloys, such as silicon steel, and a clad material, such as CIC, are substantially the same as the thermal expansion coefficient of silicon. However, they have large specific gravities and add weights unsuitably to be used in the circuit boards, which are processed with the large-sized cores included. Their Young's moduli of elasticity are not high, and large core substrate undesirably have bowing and waves, which causes troubles in the build-up process and in mounting semiconductor elements.

It is difficult to form thin substrates of refractory metals, such as molybdenum and tungsten whose thermal expansion coefficients are relatively approximate to the thermal expansion coefficient of silicon and which have large specific gravities. Large substrates of them are also heavy for easy handling. As for ceramics, aluminum nitride, etc., whose thermal expansion coefficients are near the thermal expansion coefficient of silicon, is very difficult to form through-holes and vias. The ceramic core substrate must be formed by cofire, which makes it impossible to provide large boards and adds to costs.

SUMMARY OF THE INVENTION

An object of the present invention is to provide a circuit board for mounting semiconductor elements, which has a thermal expansion coefficient approximate to that of silicon, and is light and thin but high rigidity and can realize high productivity and reliability, a method for fabricating the circuit board, and an electronic device.

According to one aspect of the present invention, there is provided a circuit board comprising: a core substrate of a fiber reinforced metal; an insulating layer formed on the core substrate; and an interconnection layer formed on the insulating layer.

According to another aspect of the present invention, there is provided an electronic device comprising: a circuit board including a core substrate formed of a fiber reinforced metal; and an LSI chip mounted on the circuit board.

According to further another aspect of the present invention, there is provided an electronic device comprising: a motherboard; a circuit board mounted on the motherboard and including a core substrate formed of a fiber reinforced metal; and an LSI chip mounted on the circuit board.

According to the above-described invention, the core substrate of the circuit board is formed of a substrate of the fiber reinforced metal, whereby the thermal expansion coefficient of the circuit board can be approximate to the thermal expansion coefficient of LSI chips to thereby realize an electronic device which is superior in heat radiation. The circuit board according to the present invention has higher connection reliability in comparison with electronic devices, as of BGA, etc., using the conventional both-sided circuit board and can mount semiconductor elements having higher radiation. In the circuit board according to the present invention, the metal core layer can be used as a ground plane, which will realize the effect of reducing noises and allows electronic devices to meet higher performance requirements.

According to further another aspect of the present invention, there is provided a circuit board including a core layer which functions as a reinforcement material, wherein the core layer includes carbon fibers. Accordingly, the core layer includes carbon fibers, whereby thermal expansion coefficient changes of the circuit board can be small, and a mechanical strength of the circuit board can be improved. Thus, the generation of deformations (strains, bowing, etc.) of the circuit board can be prevented, and the connection reliability with electronic parts to be mounted on the circuit board can be improved.

In the above-described circuit board, it is preferable that the core layer has a composite structure of the carbon fibers and an insulating resin. Accordingly, a composition ratio of the carbon fibers and the insulating resin is adjusted, whereby a thermal expansion coefficient and strength of the core layer can be adjusted. The carbon fibers are solidified by the insulating resin, whereby the core layer can be used as a rigid body (a plate member) The circuit board is easy to handle in fabrication process.

In the above-described circuit board, it is preferable that the carbon fibers are a first carbon fiber group of a plurality of carbon fibers arranged in one direction, and a second carbon fiber group of a plurality of carbon fibers arranged in a direction intersecting said one direction. Accordingly, the carbon fibers arranged in the core layer include a first and a second carbon fiber groups which are arranged in different direction to intersect each other, whereby a thermal expansion coefficient and strength of the core layer can be adjusted for arrangement directions of the first and the second carbon fiber groups by arranged amounts and cross angles of the first and the second carbon fiber groups. The thermal expansion coefficient and strength of the circuit board can be adjusted corresponding to electronic parts to be mounted.

In the above-described circuit board, it is preferable that the carbon fibers are arranged in one form selected out of a mesh, a cloth or a non-woven fabric of the first carbon fiber group and the second carbon fiber group. Accordingly, the carbon fibers are formed in a mesh, a cloth and a non-woven fabric of the first and the second carbon fiber groups, whereby such forms of the carbon fibers are widely used, and costs of the core layer (circuit board) can be low.

In the above-described circuit board, it is preferable that an electrically insulating layer and an interconnection layer with a prescribed pattern of a interconnection formed on are formed on at least one surface of the core layer. Accordingly, even with the core layer with the insulating layer and the interconnection layer formed on, a thermal expansion of the circuit board as a whole is restricted by the core layer, whereby no deformation, such as bowing, bending, etc. occurs. Even micronized electronic parts of high density can be mounted on the circuit board with high interconnection reliability.

According to the further another aspect of the present invention, there is provided a method for fabricating a circuit board comprising the steps of: forming a core layer having a composite structure of a carbon fibers and an insulating resin; forming a first through-hole in the core layer; encapsulating the core layer with the through-hole formed in with an electrically insulating resin to form an insulating layer; forming a second through-hole in the insulating layer at a position where the first through-hole have been formed; and forming a conductor on the inside wall of the second through-hole and on at least one of a front surface and an under surface of the insulating layer. Accordingly, when the core layer of a composite structure of the carbon fibers and the insulating resin is formed, an arrangement of the carbon fibers and a ratio of the carbon fibers and the insulating resin are adjusted to thereby adjust a thermal expansion coefficient of the core layer. The insulating layer is formed after the first through-hole have been formed in the core layer, and the second through-hole is formed in the insulating layer at a position corresponding to the first through-hole, which facilitate forming the second through-hole, and the circuit board can be easily fabricated.

In the above-described method for fabricating the circuit board, it is preferable that the method further comprises the steps of: building up sequentially an insulating layer and an interconnection layer on the surface of the insulating layer with the conductor formed on.

In the above-described method for fabricating the circuit board, it is preferable that in the step of forming a core layer, a composition ratio of the carbon fibers and the insulating resin is varied to thereby adjust a thermal expansion coefficient.

In the above-described method for fabricating the circuit board, it is preferable that in the step of forming a core layer, the carbon fibers are divided in a first carbon fiber group and a second carbon fiber group, and the first and the second carbon fiber groups are woven in a prescribed form so as to adjust a thermal expansion coefficient.

Accordingly, the insulating layer and the interconnection layer are formed on the core layer having an adjusted thermal expansion coefficient and strength, whereby interconnection can be formed with high precision, and accordingly a terminal pitch can be small suitably to mount electronic equipments of high density.

According to further another aspect of the present invention, there is provided an electronic device comprising: a circuit board including a core layer which functions as a reinforcement material, the core layer including carbon fibers; and an electronic parts mounted on the circuit board. Accordingly, deformations (strains, bowing, etc.) of the circuit board can be prevented by the core layer, whereby electronic parts can be mounted on the circuit board with high connection reliability, and accordingly electronic device can have high reliability and yields.

DETAILED DESCRIPTION OF THE INVENTION

[A First Embodiment]

A circuit board and a method for fabricating the same according to a first embodiment of the present invention will be explained with reference to FIGS. 1 and 2A–2E.

Figure 1:
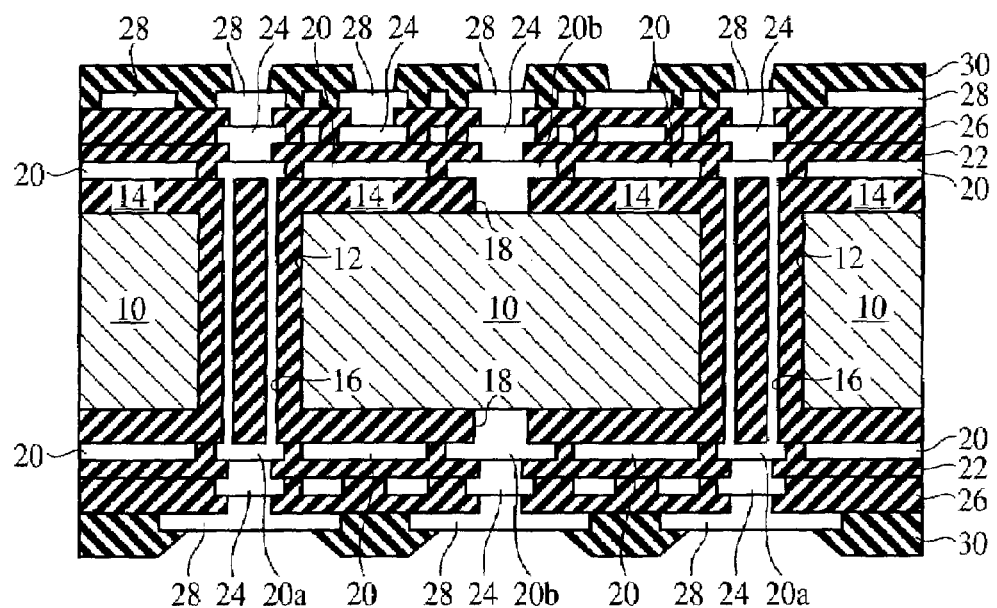
FIG. 1 is a diagrammatic sectional view of the circuit board according to a first embodiment of the present invention, which shows a structure thereof.

FIG. 1 is a diagrammatic sectional view of the circuit board according to the present embodiment, which shows the structure thereof. FIGS. 2A–2E are sectional views of the circuit board according to the present embodiment in the steps of the method for fabricating the same, which show the method.

First, the structure of the circuit board according to the present embodiment will be explained with reference to FIG. 1.

A plurality of holes 12 are formed penetrating a core substrate 10 of a fiber reinforced metal (FRM). An insulating layer 14 of a resin is formed on the surfaces of the core substrate 10 and in the holes 12. Through-holes 16 are formed in the core substrate 10 coated with the insulating layer 14 through the insulating layer 14 in the holes 12. Via holes 18 are formed in the insulating layer 14 down to the core substrate 10.

Interconnection layer 20 which contain interconnection 20a for connecting interconnections formed on the front side and the back side of the core substrate 10 through the through-holes 16 and interconnection 20b electrically connected to the core substrate 10 through the via holes 18 are formed on both surfaces of the core substrate 10 coated with the insulating layer 14. Insulating layers 22, 26 and interconnection layers 24, 28 are repeatedly laid on the core substrate 10 with the interconnection layer 20 formed on.

Semiconductor elements (not shown) are to be electrically connected to the interconnection layers 28 via bumps (not shown) At least signal lines of the interconnection formed on the semiconductor elements-mounted side are electrically connected to the interconnection formed on the back side through the through-hole 16 and to outside electrode pad. All or a part of the GND lines (or power source lines) formed on the semiconductor elements-mounted side are connected through the via holes 18 to the core substrate 10, and to the GND lines (source lines) formed on the back side.

A metal layer of nickel-based gold, solder, palladium, silver, silver-zinc alloy or others is formed by plating, printing or other means on at least semiconductor element connecting electrodes and outside circuit connecting electrodes comprised of the interconnection layer 28. At least a part of the interconnection is coated with a overcoat layer 30 of a solder resist or others. The overcoat layer 30 can be formed of a resin, as of epoxy group, polyimide group, acrylic group, BT resin group or others, which is electrically and thermally resistive enough.

Thus, the circuit board for mounting semiconductor elements, such as a package substrate, a motherboard, etc., which includes multi-level interconnection layers formed on both sides of the core substrate 10 is constituted.

The circuit board according to the present embodiment is characterized mainly in that the core substrate 10 is formed of a flat substrate of a fiber reinforced metal. The fiber reinforced metal is a composite material formed by impregnating a base made of a fibrous material with a molten metal.

In the fiber reinforced metal used in the present invention, a fibrous material is carbon fiber or SiC fiber. Such fiber has high strength, and can ensure sufficient strength when the core substrate 10 is thinned. As will be described later, carbon fiber and SiC fiber whose thermal expansion coefficients are smaller than that of metal, are composed with a metal material to thereby effectively make a thermal expansion coefficient of the composite material low.

A metal material to impregnate the fiber material is preferably magnesium (Mg), aluminum (Al), titanium (Ti) or an alloy containing either of them. Such metal is light, and is very effective to make the core substrate 10 light.

The metal material is preferably a metal of high electric conductivity and thermal conductivity. A metal material of high electric conductivity is composed with a core substrate 10 to give the core substrate 10 itself sufficient conductivity, which allows the core substrate 10 to be used as a GND plane or a power source plane which is expected to produce the effect of reducing electric noises, via the interconnection such as the interconnection 20b exemplified in FIG. 1. A metal of high thermal conductivity is used so that the core substrate 10 can have a role of a radiating substrate (heat sink).

A content of the fiber material in the core substrate 10 is preferably in the range of 30–80 vol. %. When a content of the fiber material is below 30 vol. %, a thermal expansion coefficient of the metal material is too predominant to make the effect of decreasing a thermal expansion coefficient not enough. When a content of the fiber material is above 80 vol. %, it is difficult to impregnate a preform of the fiber material with the metal material.

Table 1 summaries thermal expansion coefficient of fiber materials and metal material at room temperatures. In Table 1, thermal expansion coefficients of polyimide resin and epoxy resin are listed as Controls.

TABLE 1

| Materials | | Thermal Expansion Coefficient ppm/° C. |
|---|---|---|
| Metal Materials | Aluminum | 23.5 |
| | Magnesium | 26.0 |
| | Titanium | 8.9 |
| | Copper | 17.0 |
| | Nickel | 13.3 |
| Fiber | Carbon | 0–2.0 |

TABLE 1-continued

| | Materials | Thermal Expansion Coefficient ppm/° C. |
|---|---|---|
| Materials | SiC | 4.0 |
| Resin | Polyimide resin | 4–100 |
| Materials | Epoxy resin | 60–120 |

As shown in Table 1, the thermal expansion coefficients of the metal materials are larger than the thermal expansion coefficient 3.5 ppm/° C. of silicon, but the thermal expansion coefficient of carbon is 0–2 ppm/° C., which is smaller than that of silicon. The thermal expansion coefficient of SiC is substantially equal to that of silicon. Accordingly, it is found that a composite material of the metal material and the fiber material is formed to thereby form the core substrate of a thermal expansion coefficient which is approximate to that of silicon.

When the thermal expansion coefficient of the composite material is made low by the fiber material, the effect is found strongly in the direction of extension of the fibers. Accordingly, in forming the core substrate 10, it is preferable to compose the metal material and the fiber material in a mesh, cloth or non-woven fabric with the fibers extended normally in two axial directions. The effect of decreasing the thermal expansion coefficient is thus improved more.

Relationships between composed states of carbon fibers as the fiber material and aluminum as the metal material, and thermal expansion coefficients are shown in Table 2.

TABLE 2

| Fiber States | Fiber Content (vol. %) | Metal Content (vol. %) | Expansion Coefficient |
|---|---|---|---|
| Mesh | 80–50 | 20–50 | 0–2 |
| Cloth | 80–50 | 20–50 | 3–6 |
| Non-woven Fabric | 60–30 | 40–70 | 8–18 |

As shown in Table 2, the thermal expansion coefficients of the composite materials change depending not only on contents of the fiber material but also on states of the fiber material.

Thus, in order to obtain the core substrate of a prescribed thermal expansion coefficient, it is preferable that materials, composition ratios and composed states of the fiber material are suitably considered.

Then, the method for fabricating the circuit board according to the present embodiment will be explained with reference to FIGS. 2A–2E.

First, a preform of the fiber material is formed. As a fiber material is, e.g., carbon fibers or SiC fibers which are formed in mesh, cloth or non-woven fabric. The mesh is different from the cloth and is multi-layers of bundles of fibers alternately laid, extended in different directions. The sectional views in the steps of the method shown in FIGS. 2A–2E are views of the fiber material in mesh.

Figure 2A:
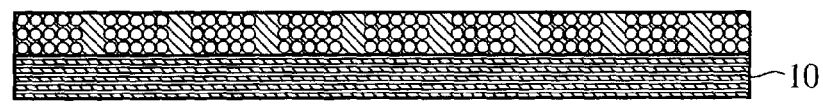
FIGS. 2A–2E are sectional views of the circuit board according to the first embodiment of the present invention in the steps of the method for fabricating the same, which show the method.

Then, the preform of the thus formed fiber material is impregnated with the molten metal material. Thus, e.g., a 0.05–0.5 mm-thick core substrate 10 formed of the composite material of the fiber material and the metal material is prepared (FIG. 2A). The metal material is preferably a material which contains aluminum, magnesium, titanium, an alloy containing either of them or others which are light and have high electrical conductivity and thermal conductivity.

Figure 2B:
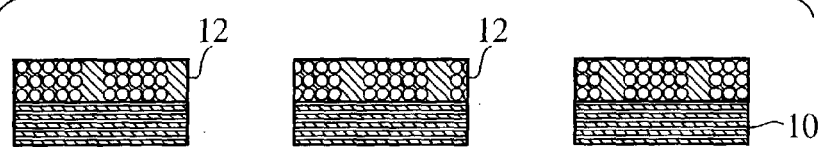

Then, the holes 12 are formed penetrating the core substrate 10 by means of, e.g., a drill (FIG. 2B). The holes 12 are in advance formed in regions where the through-holes 16 are to be formed and has a diameter of, e.g., 0.2–1.0 mm larger than an opening diameter of the through-holes 16.

Figure 2C:
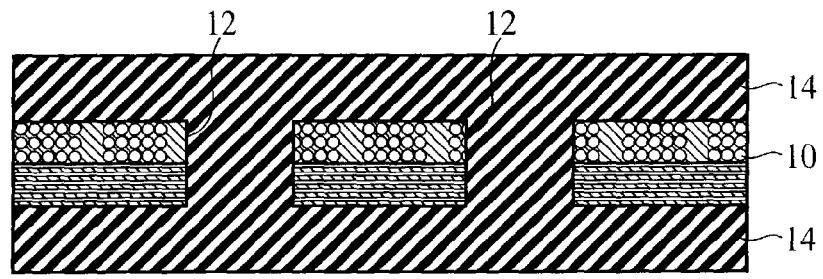

Next, the core substrate 10 is subjected to prescribed degreasing processing and washing processing and has both surfaces laminated with a resin sheet by, e.g., vacuum press to form the insulating layer 14 of the resin sheet on the surfaces of the core substrate 10. At this time, the holes 12 are also filled with the insulating layer 14 (FIG. 2C).

The resin sheet can be laminated also by using a vacuum laminator or a laminate press other than a vacuum press. The resin material forming the insulating layer 14 is suitably polyimide resin, but polyimide resin is not essential. The resin material can be a resin having good heat resistance and insulation, such as polyetherimide, polyethersulfone, epoxy resin, tetrafluoroethylene, polyurethane resin, silicone resin, acrylic resin, bismaleimide-triazine (BT) resin or others.

Figure 2D:
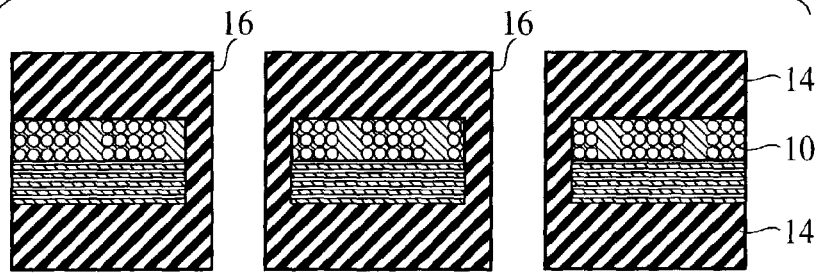
Figure 2E:
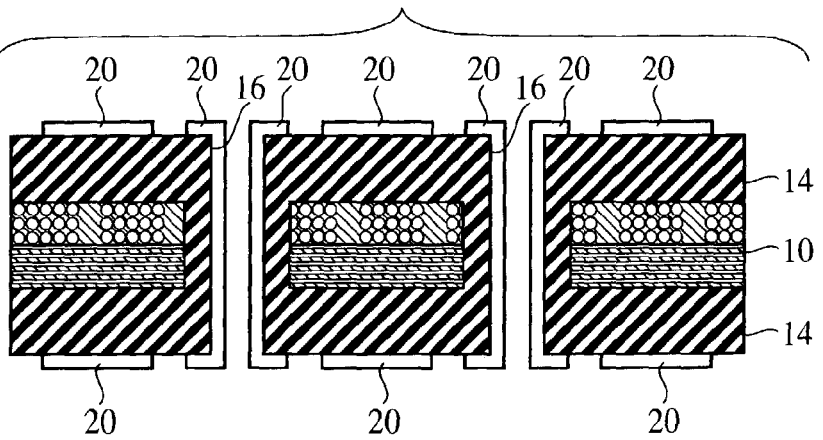

Then, the through-holes 16 are formed through the core substrate 10 in the insulating layer 14 in the region where the holes 12 have been formed (FIG. 2D). The through-holes 16 are formed in the insulating layer 14 by a laser, such as an UV-YAG laser, a carbon dioxide gas laser, an excimer laser or others, a dry etching using plasmas, a drill, a punch or other means. To form the through-holes 16, it is preferable to select a suitable method in accordance with a size of the through-holes 16.

When the core substrate 10 is used as a GND plane or power source plane, via holes (not shown) are formed in the insulating layer 14 down to the core substrate 10.

Next, interconnection layer 20 is formed on the core substrate 10 with the insulating layer 14 formed on. For example, a non-electrolytic plated copper film is formed on the entire surfaces. Then, an electrolytic plated copper film is formed on the non-electrolytic plated copper film with a dry film resist as a mask and the non-electrolytic plated copper film as a seed to grow a copper film selectively in regions for the interconnection layer 20 to be formed. Next, the dry film resist is released, and the non-electrolytic plated copper film is panel etched to form the interconnection layer 20 of the copper film.

The interconnection layer may be formed by filling, e.g., a copper paste in the through-holes 16 and then following the above-described procedure. A metal material for forming the interconnection layer is suitably copper, but copper is not essential. The metal material may be gold, silver, nickel or others.

Then, the insulating layers and the interconnection layers are repeatedly formed as required to thereby form prescribed multi-level interconnection layers on both surfaces of the core substrate 10.

As described above, according to the present embodiment, the core substrate of the circuit board is formed of a plate material of the fiber reinforced metal, whereby the circuit board can have a thermal expansion coefficient approximate to that of silicon, and is light and thin but high rigidity.

In the above-described embodiment, the multi-level interconnection layers are formed on both surfaces of the core substrate 10 but may be formed on one surface alone of the core substrate. In the case that the multi-level interconnection layers are formed on both surfaces of the core substrate, stress due to the thermal expansion coefficient difference are substantially offset between the front side and the back side. On the other hand, in the case that the multi-level interconnection layer is formed only on one surface of the core substrate, the stress is exerted as they are to the core substrate, but the core substrate of the present embodiment having high rigidity can exert desirable characteristics even in applications when the multi-level interconnection layer is formed only on one surface of the core substrate.

EXAMPLE 1

A preform of carbon fibers composed in X-Y directions was impregnated with magnesium to prepare a 0.2 mm-thick core substrate. Then, about 1000 holes of a 0.5 mm-diameter were formed in the thus-prepared core substrate by means of a drill.

Then, the core substrate was subjected to prescribed degreasing processing and washing processing and had both surfaces laminated with a 0.05 mm-thick thermoplastic polyimide sheet by a vacuum press under conditions of 200° C. and 30 min. Through-holes of a 0.2 mm-diameter were formed through the centers of the holes filled with the resin by a UV-YAG laser.

Next, a non-electrolytic plated copper film is formed on the entire surface. Then, a dry film resist having a pattern of an interconnection to be formed is formed on the non-electrolytic plated copper film. Then, the electrolytic plated copper film is formed on the non-electrolytic plated copper film to form the interconnection. Then, the dry film resist is released, and the non-electrolytic plated copper as a seed layer was panel etched. An etchant was a mixed liquid of an aqueous solution of hydrogen peroxide and sulfuric acid.

Then, 5 interconnection layers were formed on both surfaces of the core substrate by the same process. Overcoat layers were formed by both screen printing and photolithography.

The thus-prepared circuit board and an organic core circuit board prepared by the conventional process were compared in the bowing amount of the circuit boards. The result was that the organic core circuit board had an about 30 µm bowing over a 20 mm-span of a chip mounting area, but the circuit board of the present example desirably had a below 10 µm-bowing in the same area.

The circuit board of the present example and the organic core circuit board were subjected to 1000 cycles of the thermal cycle test of one cycle of −65° C., 30 min~+125° C., 30 min. The result was that the connection resistance change rate of the circuit board of the present example was below +10%, and neither cracks nor peeling took place in the solders and pads, while in the organic core circuit board, cracks were observed in the interfaces of the solders at the chip corners and the pads.

EXAMPLE 2

A preform of carbon fibers composed in X-Y directions was impregnated with aluminum to prepare a 0.2 mm-thick core substrate. Then, about 1000 holes of a 0.5 mm-diameter were formed in the thus-prepared core substrate by means of a drill.

Then, the core substrate was subjected to prescribed degreasing processing and washing processing and had both surfaces laminated with a 0.05 mm-thick epoxy resin sheet by a vacuum press under conditions of 170° C. and 30 min. Through-holes of a 0.2 mm-diameter were formed through the centers of the holes filled with the resin by a UV-YAG laser.

Then, copper paste was filled in the thus-formed through-holes, and excessive copper paste was removed by buff polishing.

Next, a non-electrolytic plated copper film is formed on the entire surface. Then, a dry film resist having a pattern of an interconnection to be formed is formed on the non-electrolytic plated copper film. Then, the electrolytic plated copper film is formed on the non-electrolytic plated copper film to form the interconnection. Then, the dry film resist is released, and the non-electrolytic plated copper as a seed layer was panel etched. An etchant was a mixed liquid of an aqueous solution of hydrogen peroxide and sulfuric acid.

Then, 5 interconnection layers were formed on both surfaces of the core substrate by the same process. Overcoat layers were formed by both screen printing and photolithography.

The thus-prepared circuit board and an organic core circuit board prepared by the conventional process were compared in the bowing amount of the circuit boards. The result was that the organic core circuit board had an about 30 µm bowing over a 20 mm-span of a chip mounting area, but the circuit board of the present example desirably had a below 10 µm-bowing in the same area.

The circuit board of the present example and the organic core circuit board were subjected to 1000 cycles of the thermal cycle test of one cycle of −65° C., 30 min~125° C., 30 min. The result was that the connection resistance change rate of the circuit board of the present example was below +10%, and neither cracks nor peeling took place in the solders and pads, while in the organic core circuit board, cracks were observed in the interfaces of the solders at the chip corners and the pads.

The semiconductor device fabricated by using the circuit board of the present examples were compared with the semiconductor devices using the usual printed circuit substrate having functions equivalent to the former semiconductor devices, and the former semiconductor devices were found to have good heat radiation.

[A Second Embodiment]

A semiconductor device according to a second embodiment of the present invention will be explained with reference to FIG. 3. The same members of the present embodiment as those of the circuit board and the method for fabricating the same according to the first embodiment are represented by the same reference numbers not to repeat or to simplify their explanation.

Figure 3:
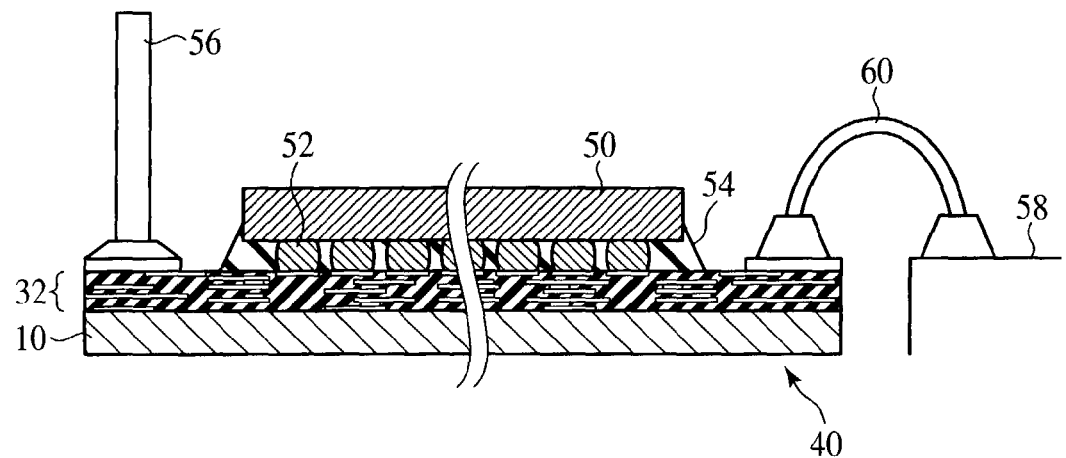
FIG. 3 is a diagrammatic sectional view of a semiconductor device according to a second embodiment of the present invention, which shows a structure thereof.

FIG. 3 is a diagrammatic sectional view of the semiconductor device according to the present embodiment, which shows a structure thereof.

On one surface of the core substrate 10 of the fiber reinforced metal, a multi-level interconnection layer 32 of insulating layers and interconnection layers repeatedly alternately laid is formed. The circuit board 40 with the multi-level interconnection layer 32 formed on one surface alone of the core substrate 10 is thus formed.

LSI chip 50 is connected to the circuit board 40 via bumps 52. An under-fill 54 is buried between the circuit board 40 and the LSI chip 50.

On the circuit board 40, a pin 56 and a FPC (flexible printed circuit) 60 for the connection to outside electronic circuits 58 (or a motherboard) are formed. The FPC 60 is a circuit board having the base film formed of polyimide film or others, and is thin and flexible. A copper interconnection is formed on the base film.

As described above, the semiconductor device according to the present embodiment is characterized in that the LSI chip 50 is mounted on the circuit board according to the first embodiment.

In using the circuit board 40 according to the first embodiment in such mode, it is preferable to design the core substrate 10 so as to have the thermal expansion coefficient, e.g., 0.5–6.5 ppm/° C. approximate to about 3.5 ppm/° C., which is the thermal expansion coefficient of silicon at room temperatures. This is true with applications where the circuit board according to the present invention is used as mounting structures, such as LGA (land grip array package), motherboards, etc.

The circuit board 40 is thus fabricated, whereby stress exerted between the circuit board 40 and the LSI chip 50 can be decreased, and the connection reliability between the circuit board 40 and the LSI chip 50 can be improved.

As described above, according to the present embodiment, the core substrate of the circuit board is formed of a substrate of the fiber reinforced metal to thereby make a thermal expansion coefficient of the core substrate substantially equal to that of the LSI chip, whereby stress exerted between the circuit board 40 and the LSI chip 50 can be decreased. The core substrate formed of a substrate of the fiber reinforced metal is light and thin but has high rigidity, whereby the semiconductor device can be light.

In the present embodiment, the circuit board according to the present invention is used in an application where the multi-level interconnection layer is formed on one surface thereof. However, the circuit board can be used in applications where the multi-level interconnection layers are formed on both surfaces thereof.

[A Third Embodiment]

A semiconductor device according to a third embodiment of the present invention will be explained with reference to FIG. 4. The same members of the present embodiment as those of the circuit board and the method for fabricating the same according to the first embodiment and the semiconductor device according to the second embodiment are represented by the same reference numbers not to repeat or to simplify their explanation.

Figure 4:
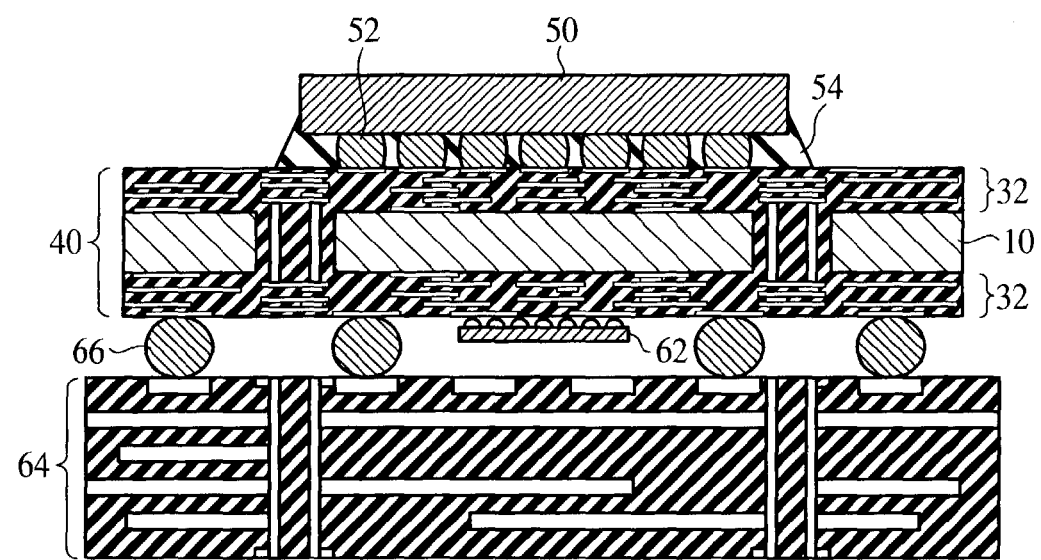
FIG. 4 is a diagrammatic sectional view of a semiconductor device according to a third embodiment of the present invention, which shows a structure thereof.

FIG. 4 is a diagrammatic sectional view of the semiconductor device according to the present embodiment, which shows a structure thereof.

On both surfaces of the core substrate 10 of the fiber reinforced metal, multi-level interconnection layers 32 of insulating layers and interconnection layers repeatedly alternately laid are respectively formed. The circuit board 40 with the multi-level interconnection layers 32 formed on both surfaces of the core substrate 10 is thus formed.

LSI chip 50 is connected to the circuit board via bumps 52. An under-fill 54 is buried between the circuit board 40 and the LSI chip 50. Decoupling capacitor 62 for removing power source noise is formed on the surface of the circuit board 40, which is different from the surface with the LSI chip 50 mounted on.

The circuit board 40 with the LSI chip 50 and the capacitor 62 mounted is connected to a motherboard 64 via bumps 66.

As described above, the semiconductor device according to the present embodiment is characterized in that the circuit board according to the first embodiment with the LSI chip 50 mounted on is mounted on the motherboard 64.

In applying as amounting structure, such as a BGA or others, the circuit board 40 according to the first embodiment, it is preferable to design the core substrate 10 so as to have the intermediate thermal expansion coefficient, e.g., 6–17 ppm/° C. between about 3.5 ppm/° C., which is the thermal expansion coefficient of silicon at room temperatures and about 8–30 ppm/° C., which is the thermal expansion coefficient of the resin substrate of the motherboard at room temperatures.

The circuit board 40 is thus structured, whereby stress exerted between the circuit board 40 and the LSI chip 50 and stress exerted between the circuit board 40 and the motherboard 64 can be optimized.

As described above, according to the present embodiment, the core substrate of the circuit board is formed of a substrate of the fiber reinforced metal to thereby control a thermal expansion coefficient of the board to be substantially intermediate between the thermal expansion coefficient of the LSI chips and the thermal expansion coefficient of the motherboard, whereby stress exerted between the circuit board 40 and the LSI chip 50 and stress exerted between the circuit board 40 and the motherboard 64 can be optimized. The core substrate of a substrate of the fiber reinforced metal is light and thin but has high rigidity, which makes the semiconductor device light.

In the present embodiment, the circuit board according to the present invention is applied to an application where the multi-level interconnection layers are formed on both surfaces of the core substrate, but can be used in applications where the multi-level interconnection layer is formed only on one surface of the core substrate.

[A Fourth Embodiment]

A circuit board and a method for fabricating the same according to a fourth embodiment of the present invention will be explained with reference to the drawings.

FIGS. 5A–5E and 6A–6D are views which show the method for fabricating the circuit board according to the fourth embodiment of the present invention along the steps of the fabrication method.

Figure 5A:
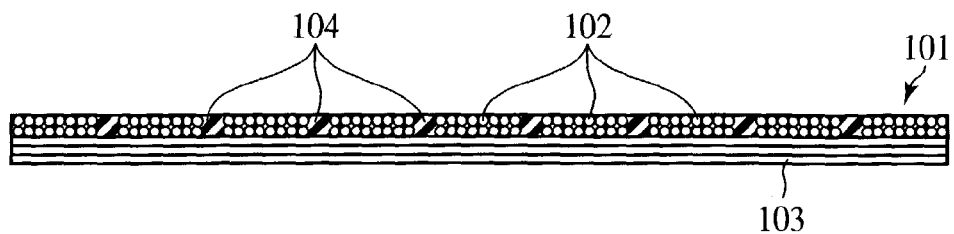
FIGS. 5A–5E and 6A–6D are sectional views of the circuit board according to the fourth embodiment of the present invention in the steps of the method for fabricating the same, which show the method.

FIG. 5A shows a core layer 101. The core layer 101 is carbon fibers impregnated with an insulating resin 104 and solidified in a plate and has a 0.05–0.5 mm thick. The carbon fibers are solidified in a plate with the insulating resin 104, and the core layer 101 can be used a rigid body. The core layer 101 can be easily handled in the steps of fabricating the circuit board which will be explained below.

The carbon fibers include a first carbon fiber group 102 arranged in one direction (X direction), and a second carbon fiber group 103 arranged in a direction (Y direction) intersecting the first carbon fiber group 102. In the present embodiment, as enlarged in FIG. 8, the first carbon fiber group 102 and the second carbon fiber group 103 cross each other. A cross angle between the first carbon fiber group 102 and the second carbon fiber group 103 is not essentially a right angle and can be suitably set.

In the present embodiment, the first carbon fibers group 102 is arranged on the second carbon fiber group 103 (this state is called a mesh). The respective carbon fibers forming the carbon fiber groups 102, 103 are substantially linear. However, the intersection between the first carbon fiber group 102 and the second carbon fiber group 103 is not essentially to this.

Figure 9:
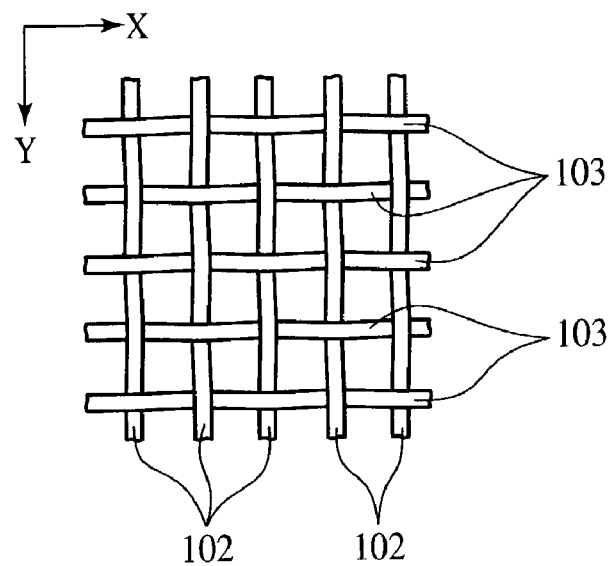

As exemplified in FIG. 9, the first carbon fiber group 102 and the second carbon fiber group 103 may be interwoven in cloth. Although not shown, the first carbon fiber group 102 and the second carbon fiber group 103 may be knitted in non-woven fabric. Mesh, cloth or non-woven fabric of the first carbon fiber group 102 and the second carbon fiber group 103 thus arranged are relatively inexpensively available on market. The layer 101 can be fabricated at low costs.

As described above, the first and the second carbon fiber groups 102, 103 are impregnated with the insulating resin 104 to be solidified. The insulating resin 104 used here can be, e.g., polysulfone, polyethersulfone, polyphenylsulfone, polyphthalamide, polyamide imide, polyketone, polyacetal, polyimide, polycarbonate, modified polyphenylene ether, polybutylene terephthalate, polyallylate, polyphenylene sulfide, polyether etherketone, tetrafluoroethylene, epoxy, bismaleimide based resins, etc.

As described above, the core layer 101 is formed of the first and the second carbon fiber groups 102, 103 impregnated with the insulating resin 104, whereby the thermal expansion change of the core layer 101 can be small, and the mechanical strength can be improved. Carbon fiber (the first carbon fiber group 102 and the second carbon fiber group 103) is a low thermal expansion material and has higher mechanical strength in comparison with the conventionally used core material (e.g., the glass epoxy resin).

Accordingly, circuit boards 120A, 120B fabricated with the core layer 101 as a core material, which will be described later (see FIGS. 7, 11 and 12) and have small thermal expansion change and improved mechanical strength, whereby the generation of deformations (e.g., strains, bowing, etc.) of the circuit boards 120A, 120B can be prevented, and the connection reliability in mounting electronic parts (semiconductor chips 121, 124, etc.) on the circuit boards 120A, 120B can be improved.

The core layer 101 can have the thermal expansion coefficient and the mechanical strength adjusted. The thermal expansion coefficient and the mechanical strength of the core layer can be adjusted by varying composition ratios of the carbon fibers (the first carbon fiber group 102 and the second carbon fiber group 103) and the insulating resin 104. Specifically, a content of the carbon fibers is increased with respect to a content of the insulating resin 104, whereby the thermal expansion coefficient can be lowered, and the mechanical strength can be improved. For this, preferably a content of the carbon fibers is within a 30–80 vol. % range.

Figure 8:
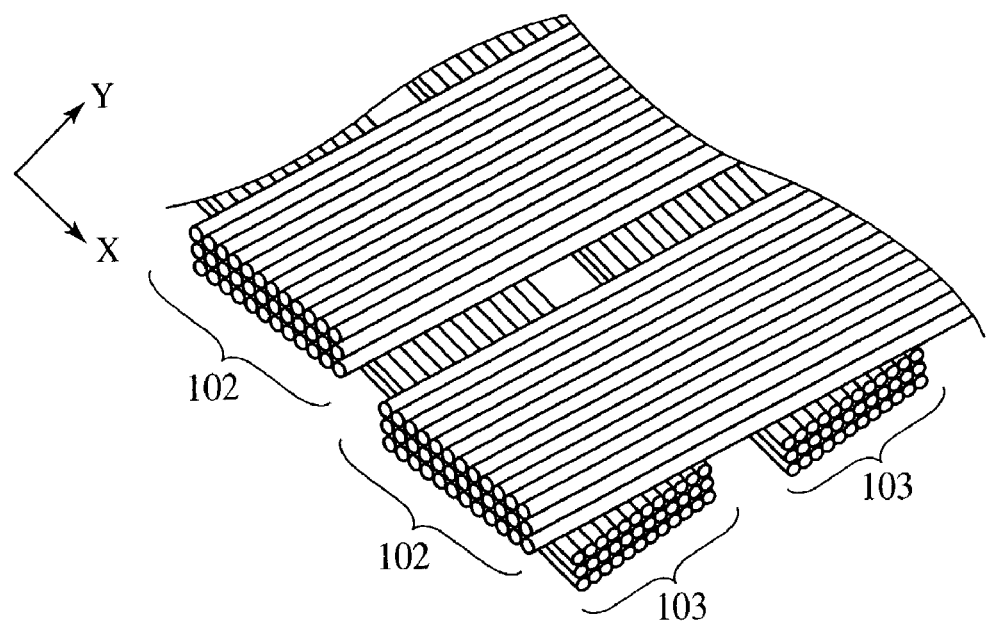
FIGS. 8 and 9 are views of examples of arrangements of a first carbon fiber group and a second carbon fiber group.

A thermal expansion coefficient and a mechanical strength of the core layer 101 can be adjusted also by weaving the first carbon fiber group and the second carbon fiber groups 102, 103. That is, in the mesh as shown in FIG. 8, of the first carbon fiber group 102 and the second carbon fiber group 103, the carbon fibers forming the first and the second carbon fibers are linear, whereby even when a tensile force is applied, the first and the second carbon fiber groups 102, 103 are never stretched. Accordingly, the core layer 101 has a higher tensile strength.

In contrast to this, in the cloth and the non-woven fabric as shown in FIG. 9, of the first and the second carbon fiber groups 102, 103, the woven carbon fiber groups 102, 103 are bent (not linear as in the mesh). Accordingly, when thermal expansion is generated, or external forces are applied, the core layer 101 is deformed by a stretch of the respective bent carbon fiber groups 102, 103. Thus, a thermal expansion amount and a deformation amount of the core layer 101 can be adjusted by the weave of the respective carbon fiber groups 102, 103.

It is possible that the core layer 101 has an orientation of the mechanical strength. This will be explained with reference to FIG. 8. The first carbon fiber group 102 extended in the Y direction as shown has high mechanical strength exerted in the arrowed Y direction, which is the extension direction of the first carbon fiber group 102. However, when a force is applied in the arrowed direction X as shown, the first carbon fiber group 102 is easily bent.

That is, the first carbon fiber group 102 has a high mechanical strength in the arrowed Y direction but a low mechanical strength in the arrowed X direction. For the same reason, the second carbon fiber group 103 extended in the arrowed X direction as shown has a high mechanical strength exerted in the arrowed X direction but a low mechanical strength exerted in the arrowed Y direction.

Accordingly, by using the above-described properties, the mechanical strength of the core layer 101 can be oriented. That is, the first or the second carbon fiber groups 102, 103 is arranged, extended in a direction in which the core layer 101 can have a mechanical strength, whereby the core layer 101 can have a mechanical strength in a desired direction.

As described above, the thermal expansion coefficient and mechanical strength of the core layer 101 can be adjusted to be arbitrary ones. As will be described later, semiconductor chips 121, 124 of silicon are mounted on the circuit board 120A fabricated according to the present embodiment (see FIG. 11). Accordingly, the thermal expansion coefficient of the core layer 101 is adjusted to be a thermal expansion coefficient which is a middle between a thermal expansion coefficient of the semiconductor chips 121, 124 and a thermal expansion coefficient of a motherboard 126 (a semiconductor device 130A with the semiconductor chips 121, 124 to be mounted on).

On the other hand, it is known that carbon fibers have high thermal conductivity in a direction of extension (the longitudinal direction) of the fibers and low thermal conductivity in a direction transverse to the extension direction. That is, in the first carbon fiber group 102 shown in FIG. 8 as an example, the first carbon fiber group 102 has high thermal conductivity (with respect to the insulating resin 104) in the direction but low thermal conductivity in the arrowed X direction as shown. This thermal conductivity characteristics is utilized to hereby give the first carbon fiber group 102 and the second carbon fiber group 103 the function of a heat radiating member, whereby the core layer 101 can be used as a heat-radiation substrate.

As described above, in the present embodiment, the core layer 101 is formed of two carbon fiber groups 102, 103. However, a single or a plurality of (3 or more) of the carbon fiber groups may be arranged in a direction in which the core layer 101 can have the strength. For example, when the core layer 101 is desired to have the strength in 5 directions, each carbon fiber group is extended in each of the 5 directions. Thus, the core layer 101 can have higher mechanical strength in the desired 5 directions.

Figure 5B:
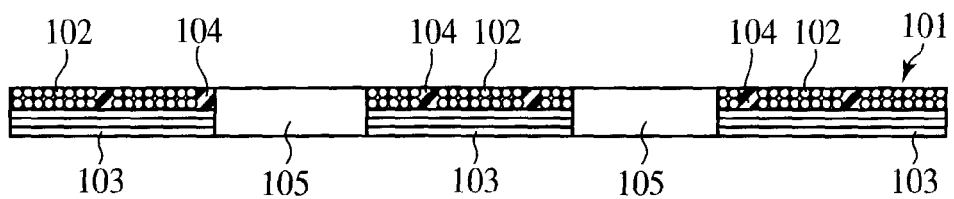

As shown in FIG. 5B, first through-holes 105 are formed in the thus-formed core layer 101. For example, about 1000 first through-holes 105 are formed in the core layer 101. A number and a shape of the first through-holes 105 are determined in consideration of interconnections of conducting layers 108, 114 which will be described later. In the present embodiment, the first through-holes 105 have a cylindrical shape of a $\phi 0.5$ mm diameter.

Figure 5C:
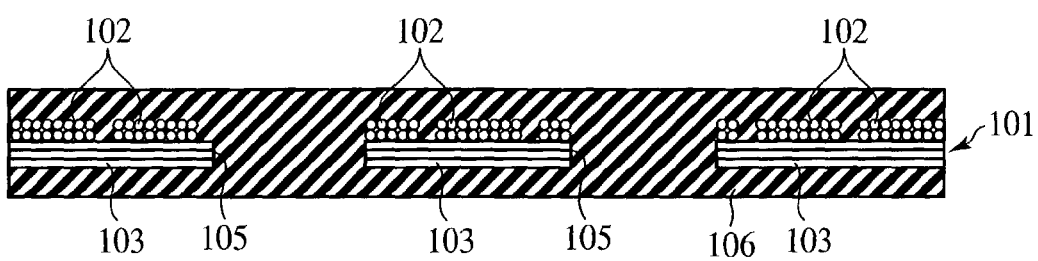

When the first through-holes 105 have been formed, the core layer 101 is subjected to prescribed degrease and cleaning. When this processing is completed, subsequently an encapsulation resin 106 is provided on the core layer 101 as shown in FIG. 5C. The encapsulation resin 106 is formed by laminating thermoplastic polyimide sheet on both surfaces by, e.g., vacuum press under conditions of 200° C. and 30 min so as to be the thickness of the encapsulation resin 106 about 0.05 mm-thick. At this time, the encapsulation resin 106 intrudes into the first through-holes 105 to thereby fill the first-through holes 105.

Figure 5D:
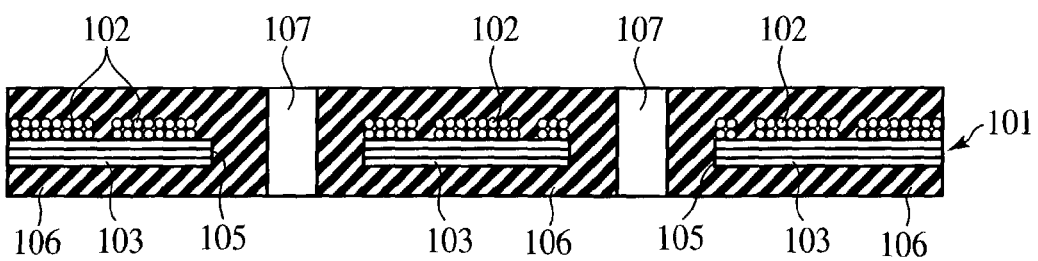

When the encapsulation resin 106 has been formed, subsequently second through-holes 107 are formed. As shown in FIG. 5D, the second through-holes 107 are formed in the encapsulation resin 106 at the positions corresponding to the positions of the first through-holes 105, specifically in the regions where the first through-holes 105 have been formed. The bore (diameter) of the second through-holes 107 is $\phi 0.2$ mm.

In the present embodiment, the second through-holes 107 are formed by a UV-YGA laser. However, the second through-holes 107 may not been essentially formed by a UV-YGA laser and may be formed by a carbon dioxide gas laser, an excimer laser or dry etching using plasmas, or may be bored by mechanical drilling or others.

As described above, in the present embodiment, the first through-holes 105 are formed in advance, and the second through-holes 107 are formed in the first through-holes 105, which facilitate the processing for forming the second through-holes 107, and the circuit board fabrication can be made easy.

When the second through-holes 107 have been formed in the encapsulation resin 106, subsequently, processing for forming a first conducting layer 108 and through-hole electrodes 109 are performed. The first conducting layer 108 and the through-hole electrodes 109 are formed at once by, e.g., plating or others. A metal material forming the first conducting layer 108 and the through-hole electrodes 109 is preferably copper. However, metal materials forming the conductors 108, 109 are not limited to copper and can be gold, silver, nickel or others.

Figure 5E:
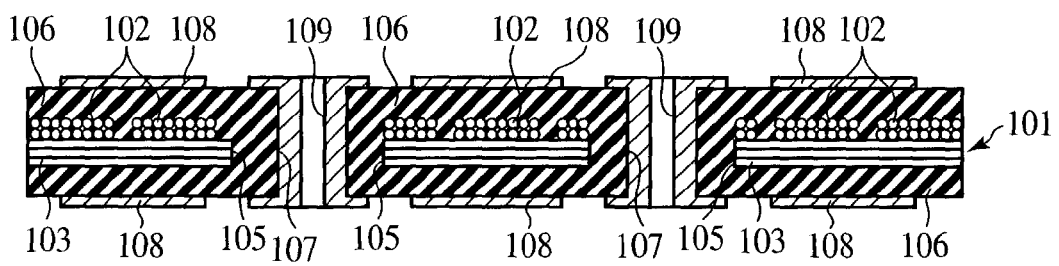
Figure 12:
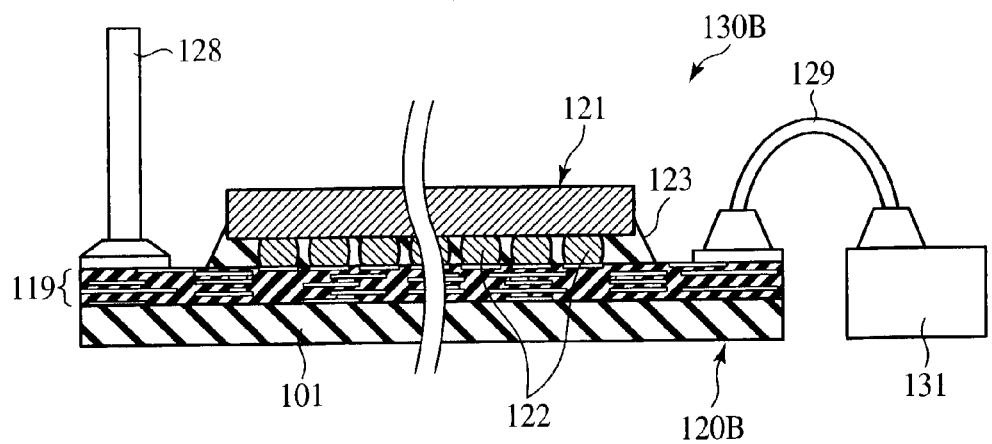
FIG. 12 is a diagrammatic sectional view of an electronic device according to the seventh embodiment of the present invention, which shows a structure thereof.

On the other hand, in the present embodiment, as shown in FIG. 5E, the first conducting layer 108 is formed both on the upper surface and the lower surface of the encapsulation resin 106. However, the first conducting layer 108 is not essentially formed on both surfaces of the encapsulation resin 106. For example, when the circuit board 120B suitable for a semiconductor device 130B shown in, e.g., FIG. 12 is fabricated, the first conducting layer 108 may be formed on one surface alone of the encapsulation resin 106.

Figure 6A:
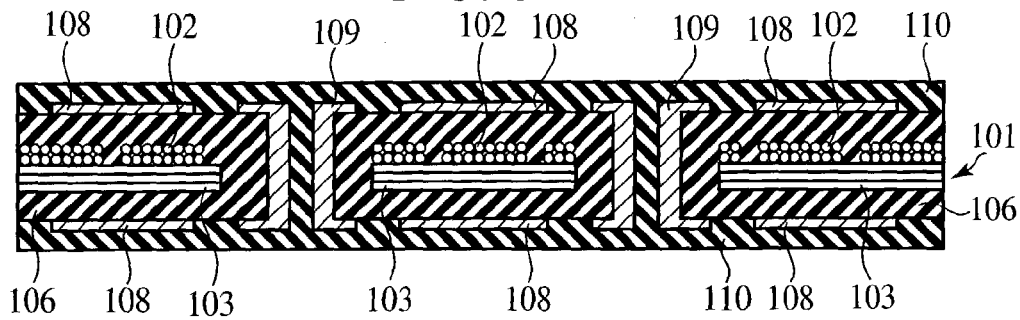
Figure 6B:
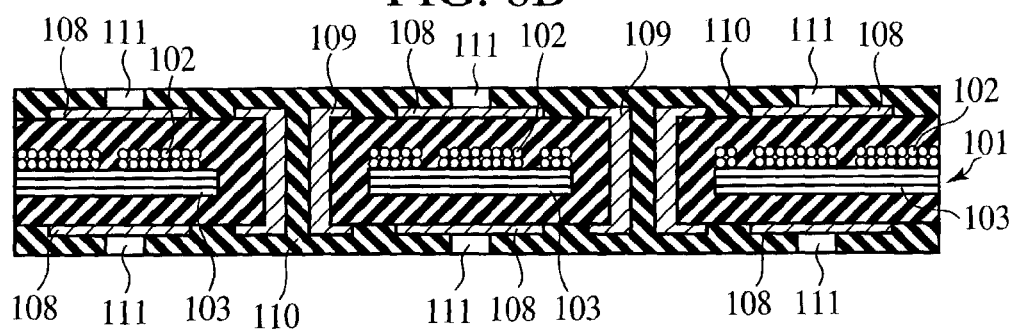

When the first conducting layer 108 and the through-hole electrodes 109 have been formed as described above, subsequently, processing for forming an insulating layer 110 is performed. FIG. 6A shows the circuit board with the insulating layer 110 formed on.

The insulating layer 110 is formed of a resin having good heat resistance and insulation, such as polyimide resin, epoxy resin, bismaleimide-triazine resin or others. The insulating film 110 can be formed by, e.g., transfer molding but is not limited to transfer molding. When the insulating layer 110 is formed, the insulating layer 110 fills also the holes in the through-hole electrodes 109.

Subsequently, when the insulating layer 110 has been formed as described above, as shown in FIG. 6B, via holes 111 are formed in the insulating layer 110. The via holes 111 are formed at positions corresponding to the positions where the first conducting layer 108 is formed.

The via holes 111 can be formed by, as are the second through-holes 107, by a UV-YAG laser, a carbon dioxide gas laser, an excimer laser or drying etching using plasmas, or can be bored by mechanical drilling or others. The via holes 111 are formed, and the first conducting layer 108 is expose to the outside through the via holes 111.

Figure 6C:
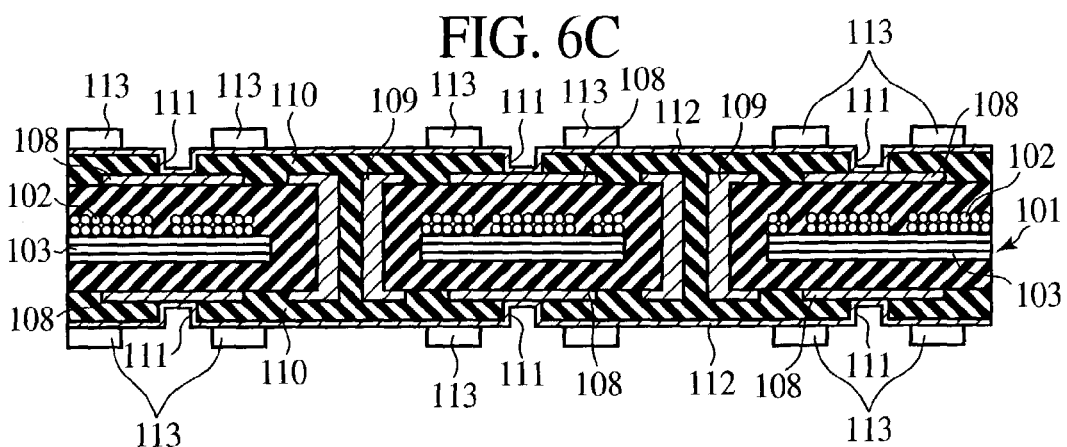

Subsequently, copper is plated by non-electrolytic plating to thereby form a plated seed layer 112 on the surface of the insulating layer 110 with the via holes 111 formed in, and the first conducting layer 108. Then, a positive resist, for example, is applied to the upper surface of the plated seed layer 112 and then is exposed, printed and developed to thereby form a resist 113 of a prescribed pattern. FIG. 6C is the state of the circuit board with the plated seed layer 112 and the resist 113 formed.

Figure 6D:
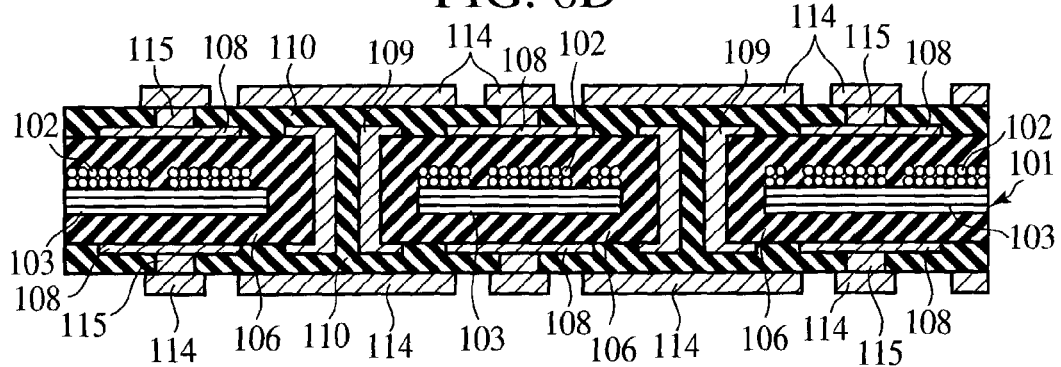

Then, copper plating is performed on the plated seed layer 112 by electrolytic plating to form a second conducting layer 114. Then, the resist 113 is released, and the plated seed layer 112 is panel etched. An etchant used at this time can be, e.g., a mixed liquid of an aqueous solution of hydrogen peroxide and sulfuric acid. Thus, as shown in FIG. 6D, the circuit board with the second conducting layer 114 formed on the core layer 101 with the encapsulation layer 106 and the insulating layer 110 formed therebetween is fabricated.

Figure 7:
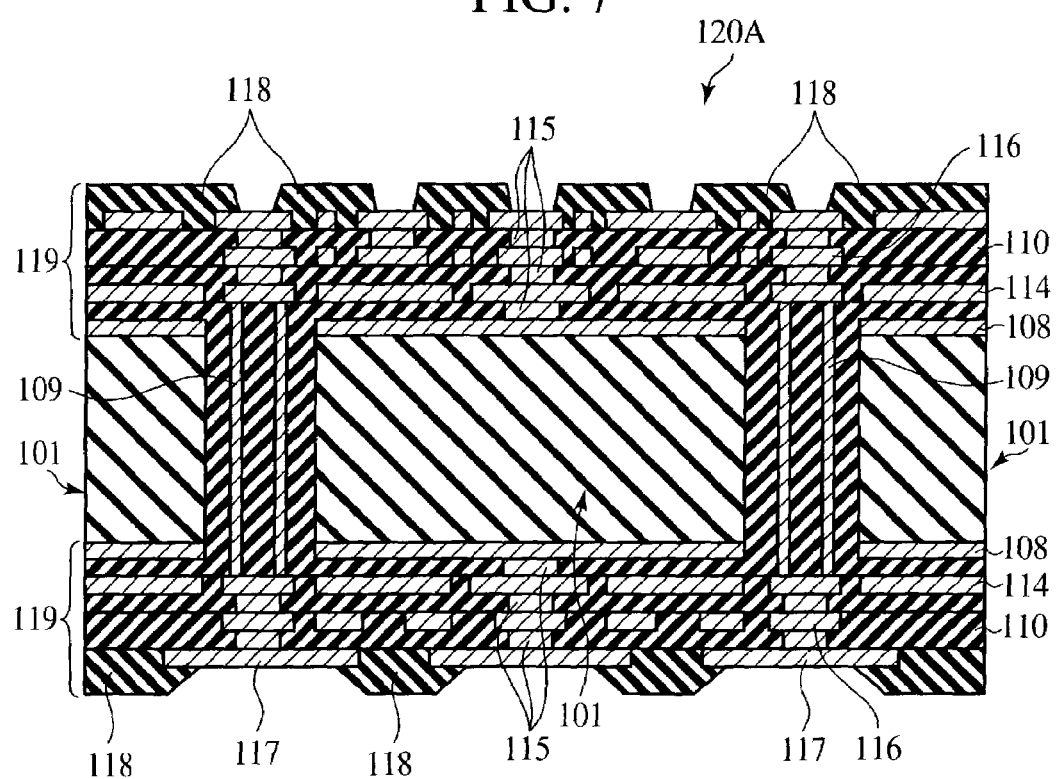
FIG. 7 is a diagrammatic sectional view of the circuit board according to a first embodiment of the present invention, which shows a structure thereof.

Subsequently, the above-described steps shown in FIGS. 6A to 6D are repeated times corresponding to a number of the conducting layers to be layered. FIG. 7 shows a circuit board 120A fabricated by the fabrication method according to the present embodiment. In the example shown in FIG. 7, the conducting layer is formed in 4 layers (the first conducting layer 108, the second conducting layer 114, the third conducting layer 116 and the fourth conducting layer 117). However, a layer number of the conducting layers is not limited to the above-described number and can be layered in arbitrary numbers.

Surface insulating layer 118 is formed on the uppermost layer, the fourth conducting layer 117 at upper prescribed positions. The surface insulating layer 118 is formed by forming an overcoat layer of an insulating resin on the entire upper surface and removing the electrode parts to be connected to the outside by screen printing and photolithography. The insulating resin can be electrically and thermally good resin, such as epoxy group, polyimide group, acryl group, BT group or others.

In the following description, the layered conducting layers 108, 114, 116, 117, the insulating layer 110, the via electrodes 115 as a whole are called a build-up layer 119. In the circuit board 120A shown in FIG. 7, the build-up layers 119 are formed respectively on the upper surface and the lower surface.

The circuit board 120A fabricated as described above had a smaller bending amount in comparison with the organic core circuit board fabricated by the conventional fabrication method. Specifically, the organic core circuit board had an about 30 μm bending in a 20 mm-span of a chip mounting area. In the circuit board 120A according to the present embodiment, the bending was preferably below 10 μm in the same area.

This is because the circuit board 120A according to the present embodiment incorporates the core layer 101 formed of the first carbon fiber group 102 and the second carbon fiber group 103 having small thermal expansion coefficient and high mechanical strength. Thus, even when the build-up layer 119 is formed on the core layer 101, the thermal expansion of the circuit board 120A as a whole is restricted by the core layer 101, whereby the deformation, such as bowing and bending of the circuit board 120A can be prevented. In using the circuit board 120A as a board for mounting micronized and high-density electronic parts, the electronic parts can be mounted with high connection reliability.

[A Fifth Embodiment]

The method for fabricating the circuit board according to a fifth embodiment of the present invention will be explained.

Figure 10A:
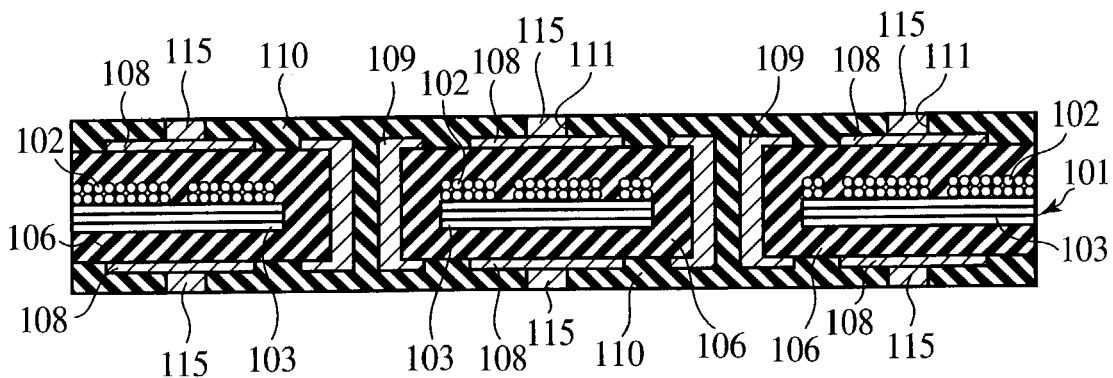
FIGS. 10A–10C are sectional views of the circuit board according to the fifth embodiment of the present invention in the steps of the method for fabricating the same, which show the method.
Figure 10B:
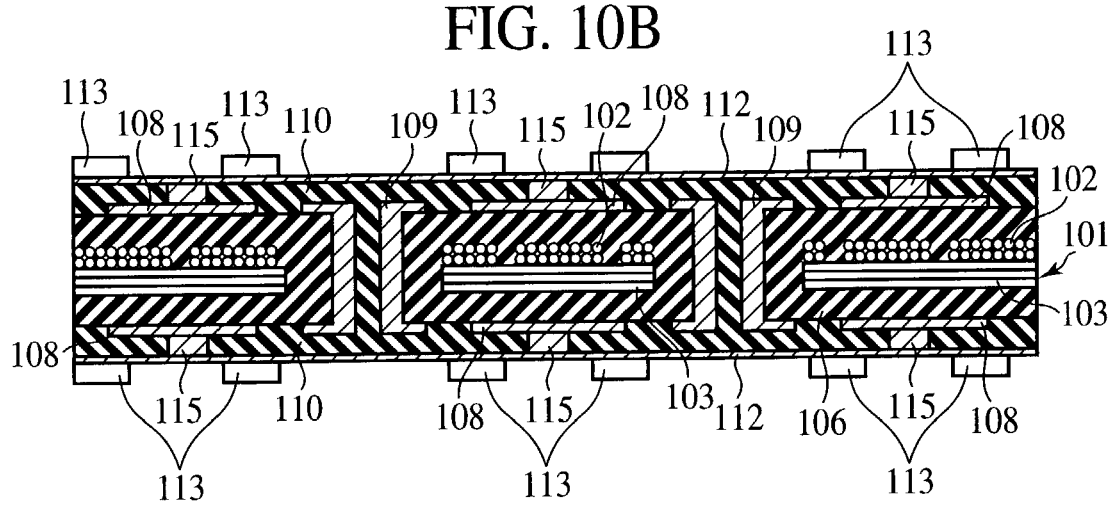
Figure 10C:
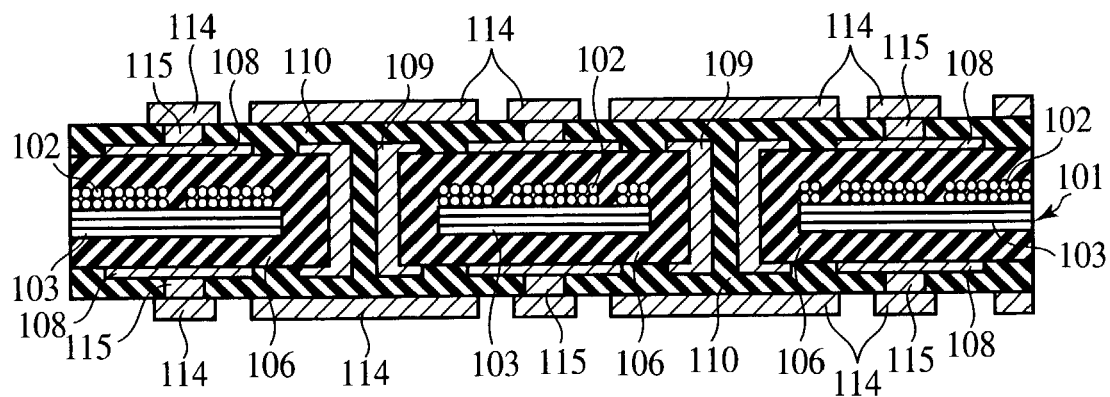

FIGS. 10A–10C are views explaining the method for fabricating the circuit board according to the present embodiment. The same members of the method for fabricating the circuit board according to the present embodiment as those of the method for fabricating the circuit board according to the fourth embodiment shown in FIGS. 5A–5E and 6A–6D are represented by the same reference numbers not to repeat or to simplify their explanation. The steps of the method for fabricating the circuit board according to the fourth embodiment, which are shown in FIGS. 5A–6B are the same as those of the method for fabricating the circuit board according to the present embodiment. The fabrication steps following the step of forming the via holes 111 in the insulating layer 110 will be explained below.

In the present embodiment, as shown in FIG. 10A, via electrodes 115 are formed in via holes 111, and the via electrodes 115 are electrically connected to the first conducting layers 108. The via electrodes 115 are formed by filling the vial holes 111 with copper paste and removing an excess of the copper paste by buff polishing. Accordingly, the upper surfaces of the via electrodes 115 are flash with the upper surface of the insulating layer 110. An excess of the via electrodes 115 can be removed by a polishing machine, such as a vibration sander, a belt sander or others, other than the buff polishing.

Subsequently, a plated seed layer 112 is formed on the upper surface of the via electrodes 115 and the upper surface of the insulating layer 110 by non-electrolytic plating. A positive resist is applied to the upper surface of the plated seed layer 112, and is exposed, printed and developed to form a resist 113 of a prescribed pattern. FIG. 10B is the state of the circuit board with the plated seed layer 112 and the resist 113 formed.

Next, copper is plated on the upper surface of the plated seed layer 112 by electrolytic plating to form a second conducting layer 114. Then, the resist 113 is released, and the plated seed layer 112 panel etched. An etchant used at this time is, a mixed liquid of an aqueous solution of hydrogen peroxide and sulfuric acid. Thus, as shown in FIG. 10C, the circuit board with the second conducting layer 114 formed on the core layer 101 with an encapsulation layer 106 and an insulating layer 110 formed therebetween is fabricated. Subsequently, the above-described steps shown in FIGS. 6A, 6B, 10A and 6D are repeated times corresponding to a number of the conducting layer to be layered.

By the fabrication method according to the present embodiment as well, a circuit board 120A with build-up layers 119 formed on the core layer 101 can be fabricated, as in the fourth embodiment.

[A Sixth Embodiment]

An electronic device according to a sixth embodiment of the present invention will be explained with reference to FIG. 11.

Figure 11:
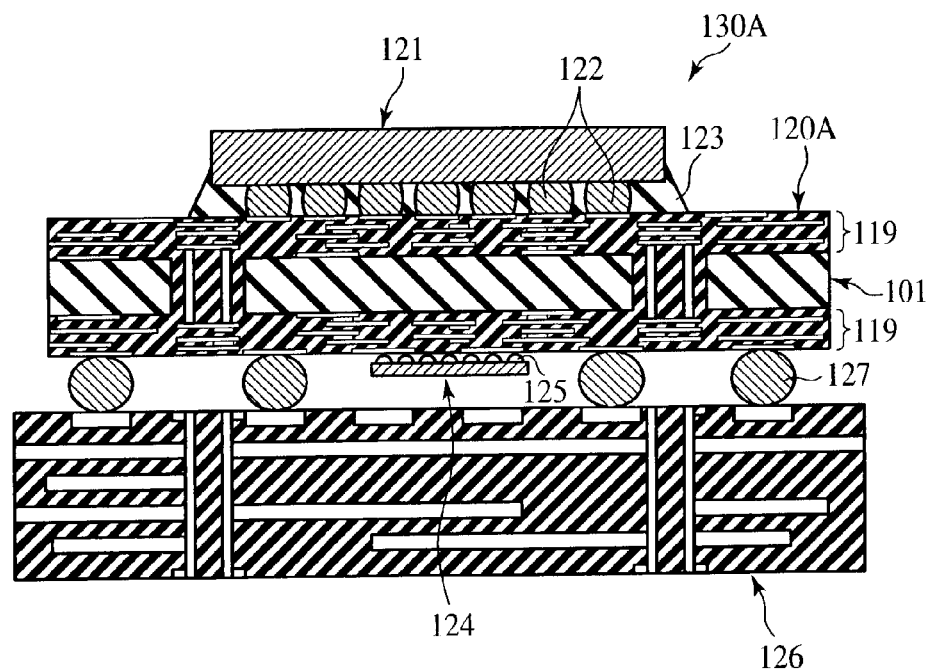
FIG. 11 is a diagrammatic sectional view of an electronic device according to the sixth embodiment of the present invention, which shows a structure thereof.

FIG. 11 shows a semiconductor device 130A using the circuit board 120A fabricated as described above. The semiconductor device 130A shown in FIG. 11 includes a semiconductor chip 121 mounted on the upper surface of the circuit board 120A, and a semiconductor chip 124 mounted on the undersurface of the circuit board 120A.

The semiconductor chip 121 is flip-chip bonded to the build-up layer 119 of the circuit board 120A by means of bumps 122. Similarly, the semiconductor chip 124 is also flip-chip bonded to the build-up layer 119 of the circuit board 120A by means of bumps 125. An under-fill resin 123 for preventing the bumps 122 from being damaged by thermal stress, etc. is provided between the semiconductor chip 121 and the circuit board 120A. Solder balls 127 as external connection terminals are provided on the build-up layer 119 positioned on the undersurface of the circuit board 120A.

The semiconductor device 130A of the above-described structure is to be mounted on the surface of a motherboard 126. As described above, in the present embodiment, a thermal expansion coefficient of the core layer 101 is adjusted to be a middle of a thermal expansion coefficient of the semiconductor chips 121, 124 and a thermal expansion coefficient of the motherboard 126.

Thus, when the semiconductor chips 121, 124 are mounted on the circuit board 120A and when the semiconductor device 130A is mounted on the motherboard 126, the generation of deformations (strains, bowing, etc.) of the circuit board 120A can be prevented, which can improve reliability for mounting the semiconductor chips 121, 124 on the circuit board 120A and mounting reliability for mounting the semiconductor device 130A on the motherboard 26.

The inventor of the present invention repeated a heat cycle test having one cycle of −65° C., 30 min~+125° C., 30 min 1000 cycles on the semiconductor device 130A without the under-fill resin 123 mounted on the motherboard 126. A connection resistance change rate of the semiconductor device 130A according to the present embodiment was below +10%, and neither crack nor release occurred in the bumps 122 and the solder balls 127.

In contrast to this, in the conventional organic core circuit board tested as a control, after 1000 cycles, cracks were observed in the interface of the solder balls at the chip corners and the pad of the motherboard 126. Thus, it has been found that by using the circuit board 120A including the core layer 101, higher reliability can be obtained in comparison with the conventional organic circuit board.

[A Seventh Embodiment]

An electronic device according to a seventh embodiment of the present invention will be explained with reference to FIG. 12.

FIG. 12 shows a semiconductor device 130B of another constitution. The semiconductor device shown in FIG. 12 is a semiconductor device of PGA (Pin Grid Array) type, and pin 128 is erected on the circuit board 120B. The semiconductor device 130B is connected to another circuit board 131 with an FPC 129. The semiconductor device 130B uses the circuit board 120B including the build-up layer 119 formed only on one surface of the core layer 101. It is not essential that the build-up layers 119 are formed on both surfaces of the core layer 101, and the build-up layer may be formed only on one surface of the core layer 101.

In the above-described embodiments, the circuit boards 120A, 120B are applied to circuit boards for mounting the semiconductor chips 121, 124. However, the application of the present invention is not limited to the circuit boards for mounting semiconductor chips and is widely applicable to the circuit boards for mounting electronic elements.

What is claimed is:

1. An electronic device comprising:
a motherboard;
a circuit board mounted on and electrically connected to the motherboard and including a core substrate formed of a fiber reinforced material;
electronic parts mounted on the circuit board,
a thermal expansion coefficient of the core substrate of the circuit board being set to be between a thermal expansion coefficient of the motherboard and a thermal expansion coefficient of the electronic parts.

2. An electronic device according to claim 1, wherein the fiber reinforced material is a composite material composed of a metal material selected from a group consisting of magnesium alloy, aluminum alloy, titanium and titanium alloy, and a fiber material selected from a group consisting of carbon fiber and SiC fiber.

3. An electronic device according to claim 2, wherein a thermal expansion coefficient of the circuit board is 6–17 ppm/° C. at room temperature.

4. An electronic device according to claim 2, further comprising:
an insulating layer formed on the core substrate; and an interconnection layer having a prescribed pattern of a interconnection formed on the insulating layer, the interconnection layer being electrically connected to a ground line or a power source line via the core substrate as a ground plane or a power source.

5. An electronic device according to claim 1, wherein the fiber reinforced material is a composite material composed of a resin material and a fiber material selected from a group consisting of carbon fiber and SiC fiber.

6. An electronic device according to claim 5, wherein a content of the carbon fibers is within a range of 30–80 vol. %.

7. An electronic device according to claim 5, wherein the carbon fibers are a first carbon fiber group of a plurality of carbon fibers arranged in one direction, and a second carbon fiber group of a plurality of carbon fibers arranged in a direction intersecting said one direction.

8. An electronic device according to claim 7, wherein the carbon fibers are arranged in one form selected out of a mesh, a cloth or a non-woven fabric of the first carbon fiber group and the second carbon fiber group.

9. An electronic device according to claim 5, wherein the insulating resin is formed of a material selected from a group consisting of polysulfone, polyethersulfone, polyphenylsulfone, polyphthalamide, polyamide imide, polyketone, polyacetal, polyimide, polycarbonate, modified polyphenylene ether, polybutylene terephthalate, polyallylate, polyphenylene sulfide, polyether etherketone, tetrafluoroethylene, epoxy, and bismaleimide based resin.

10. An electronic device according to claim 1, further comprising:

an insulating layer formed on the core substrate; and an interconnection layer having a prescribed pattern of a interconnection formed on the insulating layer.

11. An electronic device according to claim 10, wherein a through-hole electrode is formed in the core substrate and the insulating layer, the interconnection layer includes a first interconnection formed on the insulating layer on one side of the core substrate and a second interconnection formed on the insulating layer on the other side of the core substrate, the first interconnection and the second interconnection are interconnected by the through-hole electrode.

12. An electronic device according to claim 1, wherein the fiber material is formed of fibers laid in a mesh, a cloth or a non-woven fabric.

* * * * *